United States Patent

Thompson

[15] 3,639,783

[45] Feb. 1, 1972

[54] THYRISTOR CIRCUITS

[72] Inventor: Michael Ainley Thompson, Birmingham, England

[73] Assignee: Joseph Lucas (Industries) Limited, Birmingham, England

[22] Filed: Dec. 10, 1969

[21] Appl. No.: 884,010

[30] Foreign Application Priority Data

Dec. 23, 1968 Great Britain ....................60,990/68

[52] U.S. Cl. ....................307/252 M, 307/252 K, 307/252 L, 307/293, 307/305

[51] Int. Cl. ....................H03k 17/00

[58] Field of Search ...............307/252.53, 252.54, 293, 305, 307/252.55

[56] References Cited

UNITED STATES PATENTS 3,278,822 10/1966 Arnold ....................307/252 L
3,428,863 2/1969 Wright ....................307/252 L
3,535,559 10/1970 Adams ....................307/252 M

*Primary Examiner*—Donald D. Forrer
*Assistant Examiner*—David M. Carter
*Attorney*—Holman, Glascock, Downing & Seebold

[57] ABSTRACT

A known thyristor circuit has a first thyristor connected in series with a load between a pair of DC terminals. Connected across the first thyristor is a second thyristor and a capacitor in series, and there is a further circuit connected across the capacitor including a third thyristor. The capacitor charges when the second thyristor conducts, the capacitor voltage is reversed when the third thyristor conducts and the first thyristor is turned off by the capacitor when the second thyristor conducts again. In such a circuit, the invention consists in providing a timing circuit for firing the third thyristor at a predetermined fixed time after the second thyristor is fired, this period being chosen to be sufficient to allow the second thyristor to charge the capacitor.

1 Claims, 2 Drawing Figures

INVENTOR
Michael Ainley Thompson
BY
ATTORNEYS

INVENTOR
Michael Ainley Thompson
BY [signature]
ATTORNEYS

THYRISTOR CIRCUITS

This invention relates to thyristor circuits of the kind comprising first and second terminals for connection to a DC source, a load and a first thyristor connected in series between said terminals, a circuit connected across said first thyristor and including a second thyristor and a capacitor in series, a further circuit connected across said capacitor and including a third thyristor, means for firing the first and second thyristors respectively when it is desired to initiate and stop current flow in the load, and means for firing the third thyristor at a point in the cycle when the second thyristor is not conducting so as to reverse the voltage across said capacitor.

In known arrangements of this kind, the third thyristor is fired at the same time as the first thyristor, because such an arrangement is convenient. However, such an arrangement can lead to difficulties in circuits in which the first thyristor is turned on when the current flowing through the load falls to a predetermined value, and is turned off again when the current flowing through the load rises to a second predetermined value. With such an arrangement, the minimum period for which the first thyristor can be on is the time taken for the third thyristor to reverse the voltage on the capacitor, and this imposition on the minimum time period is often unsatisfactory.

The invention resides in a thyristor circuit of the kind specified in which a timing circuit is incorporated for firing the third thyristor at a predetermined fixed time after the second thyristor is fired, the period of time being chosen to be sufficient to allow the second thyristor to charge the capacitor.

Figure 1:
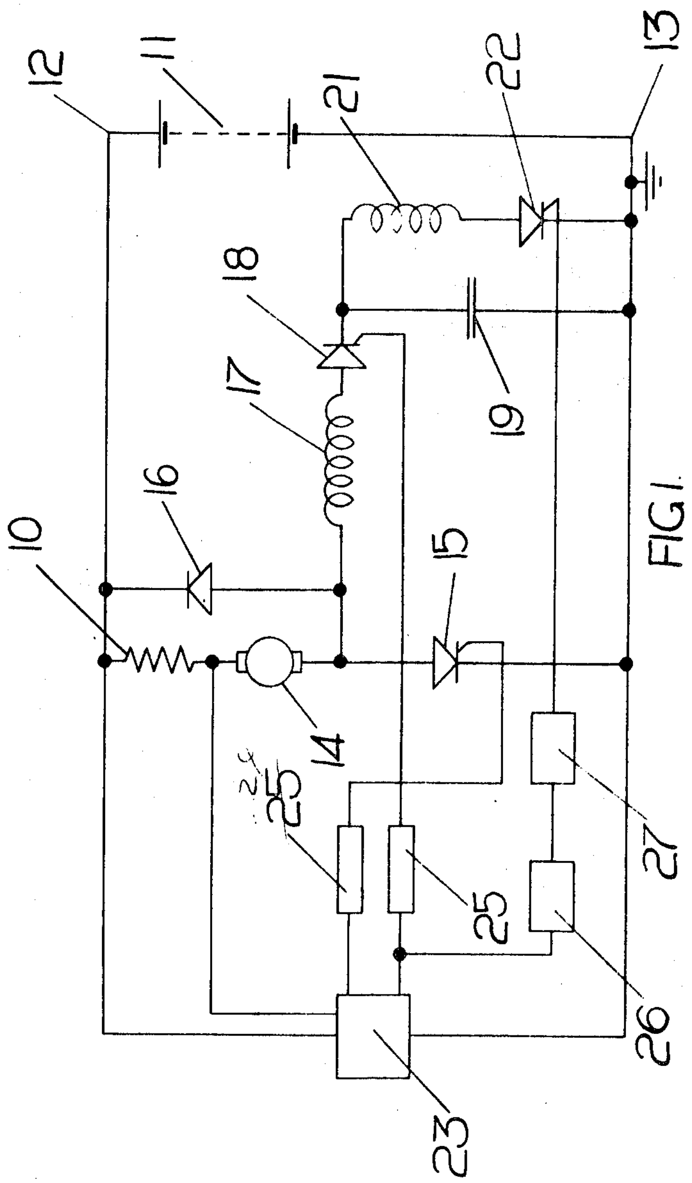
Figure 2:
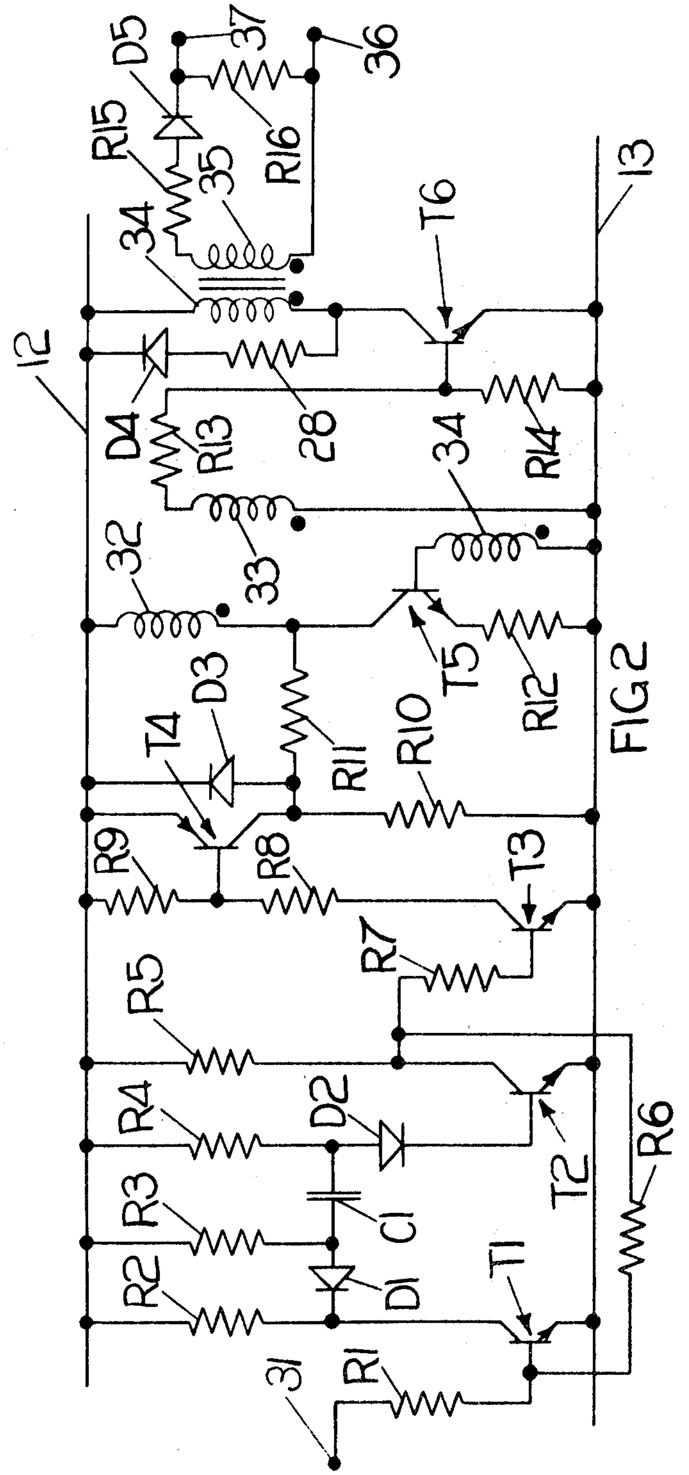

In the accompanying drawings FIG. 1 is a circuit diagram partly in block form, illustrating one example of the invention, and FIG. 2 is a detailed circuit diagram showing a timing and firing circuit used in FIG. 1.

Referring to FIG. 1, it is desired to control the traction motor 14 of a vehicle which incorporates a battery 11 having positive and negative output terminals 12, 13. Connected in series across the terminals 12, 13 are a resistor 10, the motor 14 and a thyristor 15, the motor 14 and resistor 10 being bridged by a diode 16 for conducting energy stored in the motor armature. The junction of the motor 14 and thyristor 15 is connected through an inductor 17, a thyristor 18 and a capacitor 19 in series to the terminal 13, the capacitor 19 being bridged by an inductor 21 and thyristor 22 in series.

The battery also supplies power to a control circuit 23 which receives a signal from the junction of the resistor 10 and the motor 14. Assuming for the moment that the thyristor 15 is conducting so that the current in the motor 14 is increasing, then at this stage the capacitor 19 will have a reverse voltage across it for reasons to be explained. When the current flowing in the motor 14 reaches a predetermined maximum level, the control circuit 23 produces a positive-going pulse which operates a firing circuit 25 to turn on the thyristor 18, so that the reverse voltage on the capacitor 19 is applied across the thyristor 15 to turn it off. Current flowing through the motor 14 now falls, but the thyristor 18 continues to conduct and charges the capacitor 19 to a voltage in excess of the supply voltage, at which point the thyristor 18 turns off because there is no further current flow through it. The positive pulse operating the firing circuit 25 also initiates operation of a timing circuit 26, which after a predetermined fixed time operates a firing circuit 27, which fires the thyristor 22 to reverse the voltage across the capacitor 19. The thyristor 22 then turns off. The fixed time is of course chosen to be sufficient to allow the thyristor 18 to charge the capacitor 19 and then turn off.

The above sequence of operation takes very little time, but during this time the current flowing in the motor 14 is falling. When the current reaches a predetermined minimum level, the circuit 23 produces a negative-going pulse which operates a firing circuit 24 to fire the thyristor 15 so that it turns on again and the circuit is in its original condition with the capacitor 19 reverse charged.

The maximum and minimum levels are controlled by the throttle pedal associated with the vehicle in known manner, the throttle pedal serving to vary both levels simultaneously, so as to vary the speed of the vehicle.

Referring now to FIG. 2, the circuit diagram shows the timing circuit 26 and associated firing circuit 27. The positive-going pulse from the control circuit 23 is applied to a terminal 31 which is connected through a resistor R1 to the base of a NPN-transistor T1, the emitter of which is connected to the terminal 13 and the connector of which is connected to a resistor R2 to the terminal 12. The connector of the transistor T1 is further connected through a diode D1 and a resistor R3 to the terminal 12, and the junction of the diode D1 and resistor R3 is connected through a capacitor C1 and a resistor R4 in series to the terminal 12. The junction of the capacitor C1 and resistor R4 is connected through a diode D2 to the base of an NPN-transistor T2, the emitter of which is connected to the terminal 13 and the connector of which is connected through a resistor R5 to the terminal 12. The connector of the transistor T2 is further connected through a resistor R6 to the base of the transistor T1, and through a resistor R7 to the base of an NPN-transistor T3.

The transistor T3 has its emitter connected to the line 13 and its collector connected through resistors R8, R9 in series to the terminal, 12 the junction of the resistors R8, R9 being connected to the collector of a PNP-transistor T4, the emitter of which is connected to the terminal 12 and connector of which is connected to the terminal 13 through a resistor R10. The collector of the transistor T4 is connected to the terminal 12 through a diode D2, and through a resistor R11 to the collector of an NPN-transistor T5, the emitter of which is connected to the terminal 13 through a resistor R12, and the collector of which is connected to the terminal 12 through the primary winding 32 of a transformer having a secondary winding 33 and a feedback winding 34 connected between the base of the transistor T5 and the terminal 13. One end of the secondary winding 33 is connected to the terminal 13 and its other end is connected through a resistor R13 to the base of an NPN-transistor T6, the base of which is further connected through a resistor R14 to the terminal 13, the emitter of which is connected to the terminal 13 and the collector of which is connected to the terminal 12 through the primary winding 34 of a second transformer, the winding 34 being bridged by a resistor R28 and a diode D4 in series. The second transformer has a secondary winding 35, one end of which is connected to a terminal 36 and the other end of which is connected through a resistor R15 and a diode D5 in series to a terminal 37, the terminal 36, 37 being bridged by a resistor R16, and being connected respectively to the cathode and gate of the thyristor 22.

When no signal appears at the terminal 31, the transistor T2 conducts and the capacitor C1 is charged by way of the resistor R3 and diode D2. At this stage the transistors T3, T4, T5 and T6 are all off. When a signal is received at the terminal 31, the transistor T1 turns on, so that the transistor T3 turns off and remains off for a time determined by the capacitor C1 and resistor R4, after which the circuit reverts to its initial state with transistor T2 on and transistor T1 off. During the period when transistor T2 is off, transistor T3 conducts, and provides base current to the transistor T4, which removes current from the winding 32. When the transistor T2 turns on again, the transistors T3 and T4 are turned off, and current builds up in the winding 32, the feedback to the winding 34 turning on the transistor T5, so that the single-shot blocking oscillator constituted by the transistor T5 and windings 32, 33, 34 provides a signal to turn on the transistor T6, which in turn acts through the transformer 34, 35 to provide a signal of predetermined amplitude and width between the gate and cathode of the thyristor 22 to turn it on.

The firing circuit 24 is triggered from the same terminal 31, and takes exactly the same form as the part of the circuit shown starting with the resistor R5 and transistor T2, but omitting the feedback connection through resistor R6. Thus, the terminal 31 is connected through a resistor to the base of the transistor corresponding to the transistor T2, and the remaining circuit is then as shown to the right of the resistor R5 and transistor T2 in FIG. 2. The pulse is produced in exactly the same way, but without the delay. The firing circuit 24 can also be of the same form, except of course that it is designed to be operated by a negative pulse, not a positive pulse.

Having thus described my invention what I claim as new and desire to secure by Letters Patent is:

1. A thyristor circuit comprising in combination first and second terminals for connection to a DC source, a load and a first thyristor connected in series between said terminals, a circuit connected across said first thyristor and including a second thyristor and a capacitor in series, a further circuit connected across said capacitor and including a third thyristor, means for firing the first and second thyristors respectively when it is desired to initiate and stop current flow in the load, and of the kind specified in which a timing circuit is incorporated for firing the third thyristor at a predetermined fixed time after the second thyristor is fired so as to reverse the voltage across said capacitor, the period of time being chosen to be sufficient to allow the second thyristor to charge the capacitor.

* * * * *